United States Patent [19]
Ito

[11] Patent Number: 6,018,240
[45] Date of Patent: Jan. 25, 2000

[54] CROSS-COIL MEASURING METER DRIVING DEVICE HAVING A PERIOD RANGE JUDGING MEANS AND AN AFTER-CHANGE SUPPLY PREVENTION MEANS

[75] Inventor: Tadao Ito, Shimada, Japan

[73] Assignee: Yazaki Corporation, Tokyo, Japan

[21] Appl. No.: 09/030,772

[22] Filed: Feb. 26, 1998

[30] Foreign Application Priority Data

Mar. 12, 1997 [JP] Japan ................................. 9-058048

[51] Int. Cl.$^7$ ............................. G01R 1/20; G01P 3/48
[52] U.S. Cl. ...................... 324/146; 324/166; 324/167; 702/142
[58] Field of Search ................................ 324/146, 143, 324/144, 160, 161, 163, 166, 167; 377/24, 24.1; 702/151, 142, 145, 150

[56] References Cited

U.S. PATENT DOCUMENTS

| | | | |
|---|---|---|---|
| 4,368,426 | 1/1983 | Hayashi et al. ........................ | 324/161 |
| 4,368,427 | 1/1983 | Hayashi et al. ........................ | 324/161 |
| 5,315,536 | 5/1994 | Murase et al. .......................... | 324/166 |
| 5,446,655 | 8/1995 | Fukuda et al. ......................... | 324/143 |
| 5,448,163 | 9/1995 | Murase .................................. | 324/143 |
| 5,561,374 | 10/1996 | Russ ...................................... | 324/166 |

FOREIGN PATENT DOCUMENTS

| | | | |
|---|---|---|---|
| 0 042 691 | 12/1981 | European Pat. Off. ........ | G01P 3/489 |
| 0 508 437 | 10/1992 | European Pat. Off. ......... | G01D 3/02 |
| 034 26 663 | 1/1985 | Germany .......................... | G01P 3/48 |
| 1-201167 | 8/1989 | Japan . | |
| 7-294286 | 11/1995 | Japan . | |

*Primary Examiner*—Jay Patidar
*Attorney, Agent, or Firm*—Sughrue, Mion, Zinn, Macpeak & Seas, PLLC

[57] ABSTRACT

An after-change supply prevention unit prevents a cross coil from being supplied with a driving pulse signal with a duty ratio corresponding to a deflection angle calculated based on a period of a running pulse in a duration in which a period range judging unit judges that the period of the running pulse generated with the running of a vehicle is not in a predetermined range after the input state of the running pulse is shifted from the input state at the stoppage of the vehicle to the input state in running of the vehicle. While the supply of the driving pulse signal is prevented, a driving pulse signal with a duty ratio corresponding to a deflection angle calculated based on the period of the running pulse at the stoppage of the vehicle is supplied to the cross coil.

4 Claims, 6 Drawing Sheets

CROSS-COIL MEASURING METER DRIVING DEVICE HAVING A PERIOD RANGE JUDGING MEANS AND AN AFTER-CHANGE SUPPLY PREVENTION MEANS

BACKGROUND OF THE INVENTION

The present invention relates to a device for driving a cross-coil measuring meter used as a vehicle speed meter.

Various measuring meters for visually confirming running conditions are provided on a vehicle. Of those meters, a cross-coil measuring meter is generally used as an analog type of a speed meter for confirming the running speed of the vehicle.

As a general driving device of such a cross-coil measuring meter, a driving device disclosed in Japanese Patent Unexamined Publication No. Hei. 1-201167, for example, as shown in a functional block diagram of FIG. 8, is known.

In this driving device, a running pulse signal the period of which changes in accordance with the speed of a vehicle or the rotational speed of an engine is supplied to a counter circuit 1. In this counter circuit 1, the number of clock pulses of basic clock supplied from an oscillating and dividing circuit 2 to the counter circuit 1 is counted every period of the running pulse, and the counted value is supplied, as digital data, to a sine function generating circuit 3 constituted by a ROM.

The sine function generating circuit 3 supplies a sine duty pulse generating circuit 4 with sine data of an angle θ corresponding to the value of digital data from the counter circuit 1. At the same time, on the basis of the relationship $\sin(90°\pm\theta) = \cos\theta$, the sine function generating circuit 3 supplies a cosine duty pulse generating circuit 5 with $\sin(90°\pm\theta)$ shifted by 90° in phase from the angle θ corresponding to the digital data, that is, the data of $\cos\theta$, that is, the cosine data of the angle θ.

The sine duty pulse generating circuit 4 to which the sine data of the angle θ is supplied from the sine function generating circuit 3 generates a duty pulse signal with a fixed frequency on the basis of the basic clock from the oscillating and dividing circuit 2, and outputs the duty pulse signal to a driving circuit 6. In the same manner, the cosine duty pulse generating circuit 5 supplied with the cosine data of the angle θ from the sine function generating circuit 3 generates a duty pulse signal with a fixed frequency on the basis of the basic clock from the oscillating and dividing circuit 2, and supplies the duty pulse signal to a driving circuit 7.

Then, the driving circuit 6 supplies a first pulse current $I_1$ corresponding to the sine data of the angle θ from the sine function generating circuit 3, between respective terminals $a_1$ and $a_2$ of a first coil $L_1$ constituting a cross coil L. The driving circuit 7 supplies a second pulse current $I_2$ corresponding to the cosine data of the angle θ from the sine function generating circuit 3, between respective terminals $b_1$ and $b_2$ of a second coil $L_2$ which is disposed perpendicularly to the first coil $L_1$, and constitutes a cross coil L together with the first coil $L_1$.

Consequently, a combined magnetic field of a magnetic field generated in the first coil $L_1$ and a magnetic field generated in the second coil $L_2$ is generated in the cross coil L. The vector direction of this combined magnetic field is corresponding to the speed of the vehicle or the rotational speed of the engine, that is, a measured value. A magnet rotor Mg in the cross coil L is rotated by this combined magnetic field, so that the vector direction of the combined magnetic field of the cross coil L is pointed by a not-shown pointer fixed to a rotating shaft of the magnet rotor Mg, and the measured value is indicated in cooperation with a not-shown dial plate.

In the above-mentioned cross-coil measuring meter, when the pulse period of the running pulse changes in accordance with the change of the running speed of the vehicle or the rotational speed of the engine, the sine data and the cosine data from the sine function generating circuit 3, hence the first and second pulse currents $I_1$ and $I_2$ from the driving circuits 6 and 7, respectively, the combined magnetic field of the cross coil, and the pointing direction of the pointer change following the change of the pulse period of the running pulse.

However, in the cross-coil measuring meter in which the pointer is rotated to a place corresponding to the running speed on the basis of the period of the running pulse signal, once a noise generated at the time of turning on an ignition switch of the vehicle is superimposed on the running pulse signal to generate a pulse of a fractional period in the running pulse signal, the pointer of the speed meter undesirably oscillates notwithstanding the vehicle is at a stop in fact.

As a prior art device to prevent a measuring meter from performing malfunction caused by a pulse signal generated independently of the real running of a vehicle, there is a driving device for preventing a pointer from performing malfunction caused by the influence of a noise generated from chattering of a mechanical switch, for example, as disclosed in Japanese Patent Unexamined Publication No. Hei. 7-294286.

Because of the background that chattering is generated in the structure of a mechanical switch, such a structure is adopted in this driving device that the time of generation of chattering is estimated in advance, and a running pulse signal is masked to prevent it from being reflected in calculation of its period during the estimated time from the leading edge or the trailing edge of the running pulse signal.

However, in the above-mentioned conventional driving device, the time span in which the running pulse signal is masked is fixed to the estimated time of generating chattering of a mechanical switch regarded as a factor of noise generation. Accordingly, if the engine is difficult to start, for example, due to a so-called "fogging" of an ignition plug, noise may be possibly generated for a considerably long time, so that there is a problem that it is not possible to effectively prevent malfunction of a pointer caused by the aforementioned noise at the time of turning an ignition switch on.

SUMMARY OF THE INVENTION

Taking the foregoing circumstances into consideration, it is an object of the present invention to provide a cross-coil measuring meter driving device in which, when a cross coil of a speed meter is driven on the basis of a period of a running pulse generated with the running of a vehicle, it is possible to prevent a pointer from performing malfunction caused by mixture of a pulse with a fractional period independent of the running of the vehicle into a running pulse signal to change the pulse period.

In order to achieve the above object, according to a first aspect of the invention, there is provided a cross-coil measuring meter driving device which calculates an angle of deflection corresponding to a running speed of a vehicle on the basis of a period of a running pulse generated with running of the vehicle, generates a driving pulse signal of a duty ratio corresponding to the angle of deflection, and supplies the driving pulse signal to a cross coil to drive a magnet rotor to rotate by the driving pulse signal so that a pointer connected to the magnet rotor points at a point corresponding to the angle of deflection; characterized in that the driving device comprises: a period range judging means for judging whether or not the running pulse is within a predetermined range after the input state of the running pulse is shifted from the input state when the vehicle is at a stop to the input state when the vehicle is running; and an after-change supply prevention means for preventing the cross coil from being supplied with the driving pulse signal of a duty ratio corresponding to the angle of deflection calculated based on the period of the running pulse whenever the period range judging means judges that the period of the running pulse is not within the predetermined range; the driving pulse signal of a duty ratio corresponding to the angle of deflection calculated based on the period of the running pulse when the vehicle is at a stop being supplied to the cross coil while the after-change supply prevention means is preventing the cross coil from being supplied with the driving pulse signal of a duty ratio corresponding to the angle of deflection calculated based on the period of the running pulse.

According to a second aspect of the invention, in the cross-coil measuring meter driving device of the first aspect of the invention, the period range judging means judges whether or not the running pulse is within the predetermined range, on the basis of a fact as to whether or not, when the angle of deflection calculated based on the running pulse changes from a stoppage angle of deflection corresponding to stoppage of the vehicle, the quantity of change of the angle of deflection from the stoppage angle of deflection is within a predetermined angle range corresponding to the predetermined range.

According to a third aspect of the invention, in the cross-coil measuring meter driving device of the first or second aspect of the invention, a memory element is provided separately from an electric element relating to the operation to generate the driving pulse signal based on the running pulse and the operation to supply the driving pulse signal to the cross coil, and wherein the value of the predetermined range is stored in the memory element.

According to the cross-coil measuring meter driving device of the first aspect of the invention, once a noise generated at the time of turning-on of an ignition switch of a vehicle is superimposed on a running pulse signal, a pulse of a fractional period independent of the running of the vehicle is mixed into the running pulse signal to cause a change in the pulse period of the running pulse notwithstanding the vehicle is at a stop. Then, the input state of the running pulse is apparently shifted from the input state when the vehicle is at a stop to the input state when the vehicle is running, and the pulse period of the running pulse is much shorter than the period at the time when the vehicle is at a stop because of the mixture of the fractional period pulse, so that the period range judging means judges that the period of the running pulse is not in a predetermined range.

Accordingly, a driving pulse signal of a duty ratio corresponding to an angle of deflection calculated based on the period of the running pulse when the vehicle is at a stop, is supplied to a cross coil before the fractional period pulse independent of the running of the vehicle becomes not mixed into the running pulse signal so that the period range judging means judges that the period of the running pulse is in the predetermined range. It is therefore possible to prevent a pointer from performing malfunction caused by the mixture of noise into the running pulse independently of the running of vehicle.

In addition, according to the cross-coil measuring meter driving device of the second aspect the invention, the angle of deflection calculated based on the period of the running pulse is used as a criterion of the period range judging means, instead of the period of the running pulse. It is therefore possible to calculate a threshold value to be set as a reference in accordance with the arrangement of divisions of a dial plate of a speed meter, the interval between the divisions, or the like, more easily than the period of the running pulse set as a reference.

Further, according to the cross-coil measuring meter driving device of the third aspect of the invention, when the content of the predetermined range to be the criterion of the period range judging means changes in accordance with the specification of the measuring meter such as the arrangement of divisions of a dial plate of a speed meter, the interval between the divisions, or the like, it is possible to set the predetermined range in accordance with the specification of the measuring meter by rewriting or exchanging the memory element without exchanging the electric element per se, which relates to the operation to generate the driving pulse signal from the running pulse and the operation to supply the driving pulse signal to the cross coil L.

In addition, for example, when a processing is performed to prevent such fractional oscillation of the pointer as to make it difficult to see the speed indication when the period of the running pulse changes normally in accordance with the change of the running speed of the vehicle, or when a processing is performed to make the pointer reach the aimed place of the angle of deflection as quickly as possible to thereby improve the performance of the pointer to follow up the speed change of the vehicle, etc., it is possible to set the predetermined range in accordance with the specification of the measuring meter without adding any new memory element and increasing the number of constituent parts, but by using only the existing memory element, necessary for these processings, for storing in advance data of reference values and so on in accordance with the specification of the measuring meter.

DETAILED DESCRIPTION OF THE INVENTION

A preferred embodiment of a cross-coil measuring meter driving device according to the present invention will be described below on the basis of the drawings.

Figure 1:
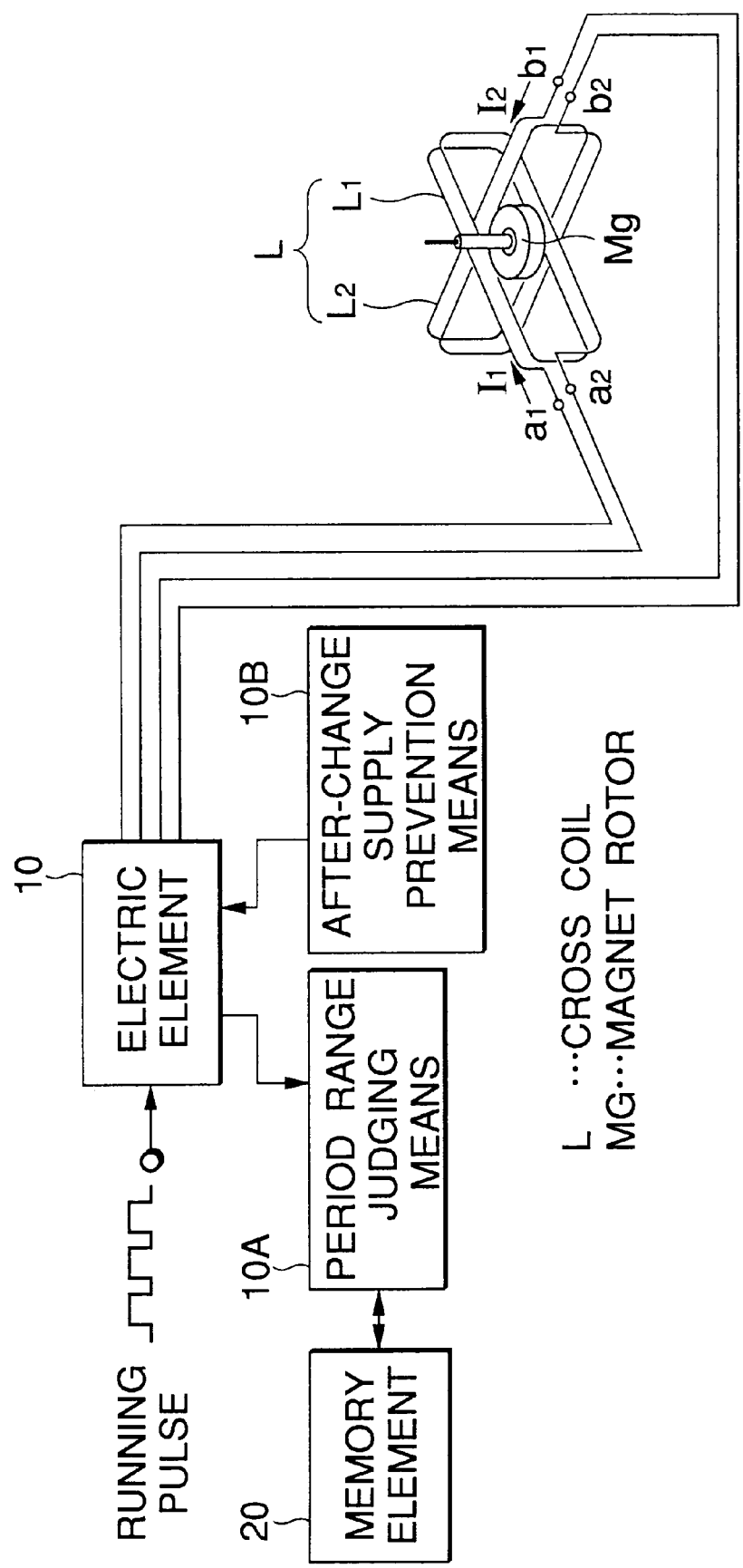
FIG. 1 is a basic structure diagram of a cross-coil measuring meter driving device according to the present invention.

FIG. 1 shows the basic configuration of a cross-coil measuring meter driving device which calculates an angle θ of deflection corresponding to a running speed of a vehicle on the basis of a period of a running pulse generated with running of the vehicle, generates a driving pulse signal of a duty ratio corresponding to the angle θ of deflection, and supplies the driving pulse signal to a cross coil L to drive a magnet rotor Mg to rotate by the driving pulse signal so that a pointer connected to the magnet rotor Mg points at a point corresponding to the angle θ of deflection. The cross-coil measuring meter driving device comprises: a period range judging means 10A for judging whether or not the running pulse is within a predetermined range after the input state of the running pulse is shifted from the input state when the vehicle is at a stop to the input state when the vehicle is running; and an after-change supply prevention means 10B for preventing the cross coil L from being supplied with the driving pulse signal of a duty ratio corresponding to the angle θ of deflection calculated based on the period of the running pulse whenever the period range judging means 10A judges that the period of the running pulse is not within the predetermined range. The driving pulse signal of a duty ratio corresponding to the angle θ of deflection calculated based on the period of the running pulse when the vehicle is at a stop is supplied to the cross coil L while the after-change supply prevention means 10B is preventing the cross coil L from being supplied with the driving pulse signal of a duty ratio corresponding to the angle θ of deflection calculated based on the period of the running pulse.

Figure 2:
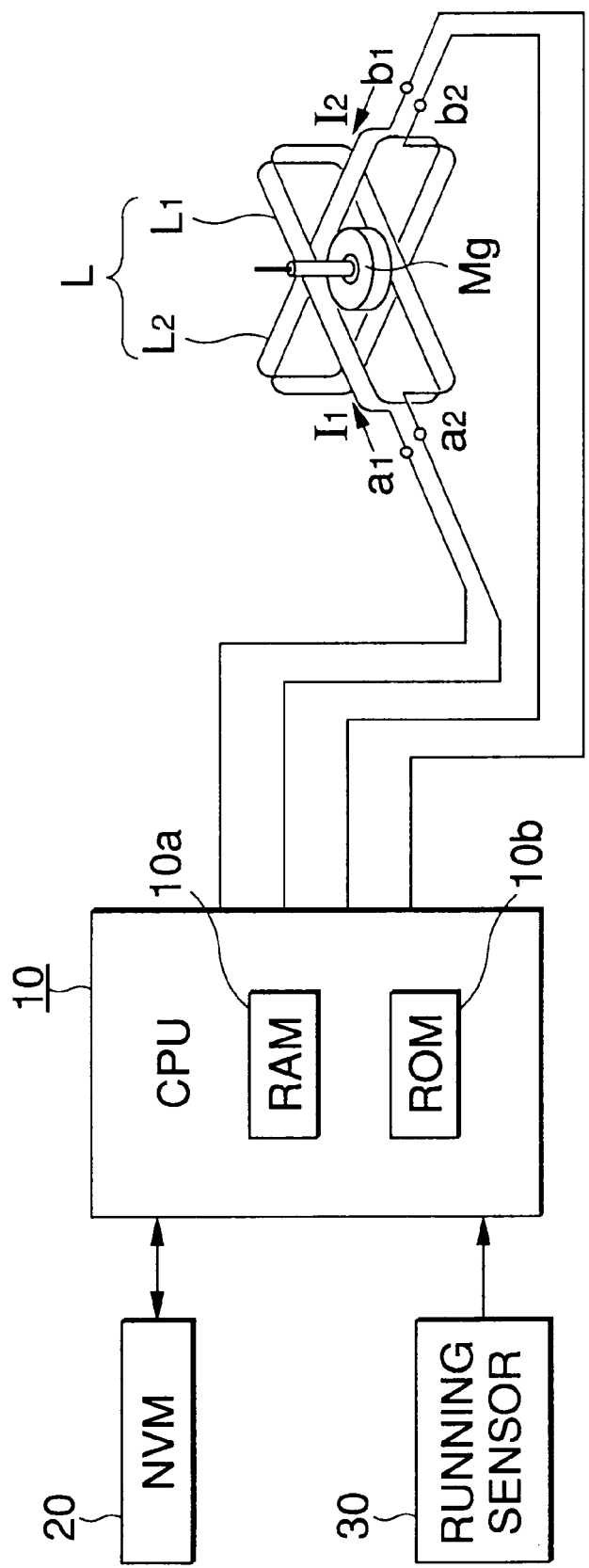
FIG. 2 is a block diagram illustrating an electric structure of a cross-coil measuring meter driving device according to an embodiment of the present invention.
Figure 8:
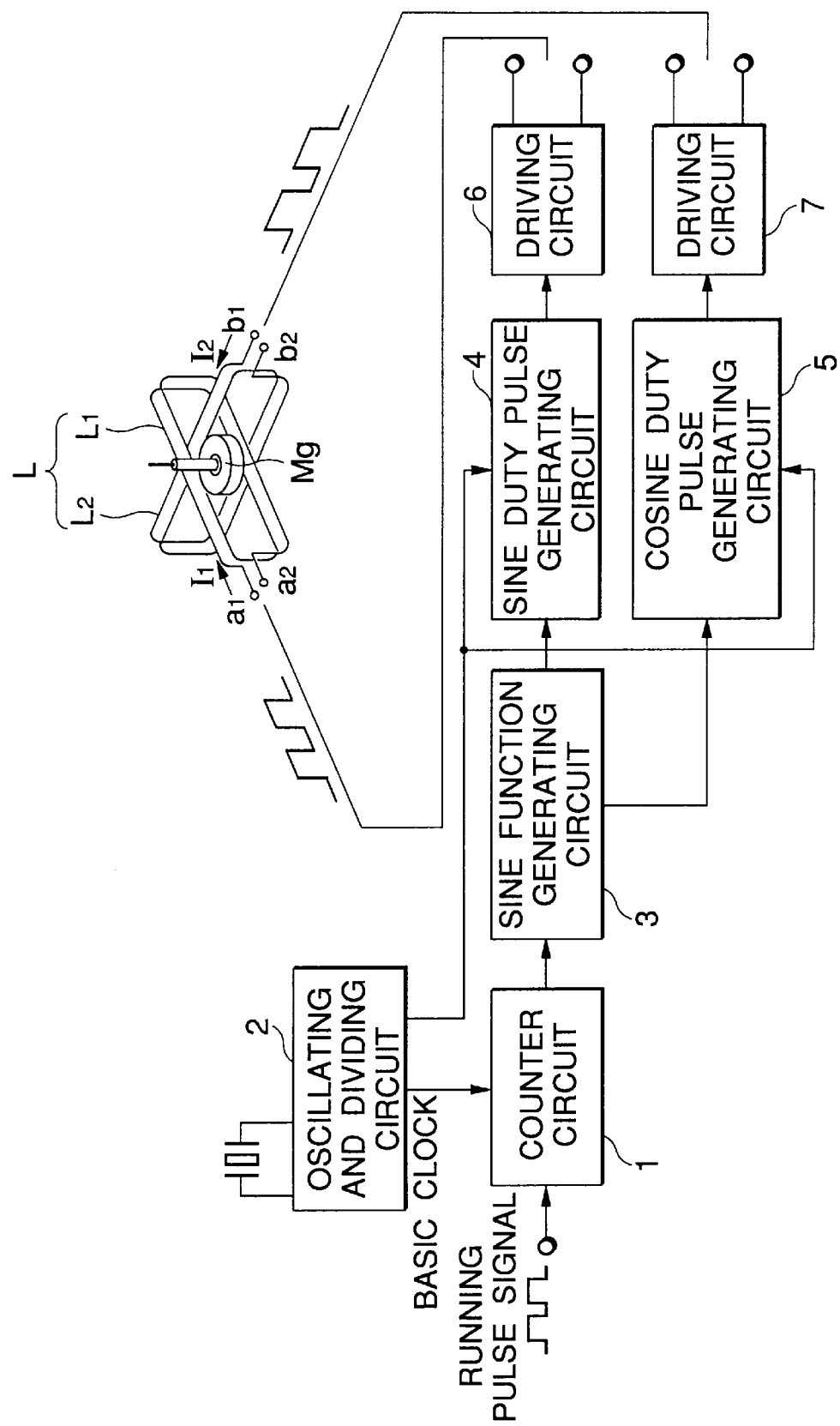
FIG. 8 is a function block diagram of a conventional cross-coil measuring meter driving device.

FIG. 2 is a block diagram illustrating an electrical structure of a driving device for a vehicle speed meter according to an embodiment of the present invention, in which a cross-coil measuring meter driving device according to the present invention is adopted. The driving device for a vehicle speed meter in this embodiment (hereinafter simply referred to as "driving device") is to supply first and second pulse currents $I_1$ and $I_2$ in accordance with the pulse period of a running pulse to a cross coil L constituted by first and second coils $L_1$ and $L_2$ perpendicular to each other in the same manner as shown in FIG. 8, respectively.

The driving device in this embodiment has a one-chip microcomputer (hereinafter abbreviated to "CPU") 10, and a nonvolatile memory (hereinafter abbreviated to "NVM") 20.

The CPU 10 (corresponding to the electric element) contains a RAM 10a and a ROM 10b. The above-mentioned NVM 20, a running sensor 30 for outputting a running pulse with the pulse number in accordance with the running distance, and the first and second coils $L_1$ and $L_2$ of the cross coil L are connected to this CPU 10, respectively.

The RAM 10a has a data area for storing various data and a work area to be used for various processing, while the ROM 10b stores a control program for making the CPU 10 serve for various processing.

The NVM 20 (corresponding to the memory element) stores a maximum fluctuating deflection angle $θ_1$ obtained by subtracting a stoppage deflection angle $θ_0$ corresponding to a running pulse from the running sensor 30 when the vehicle is at a stop, from a deflection angle $θ_{MAX}$ corresponding to a running pulse with a little shorter period than the maximum period which the running sensor 30 can output when the vehicle at a stop begins to run.

Figure 3:
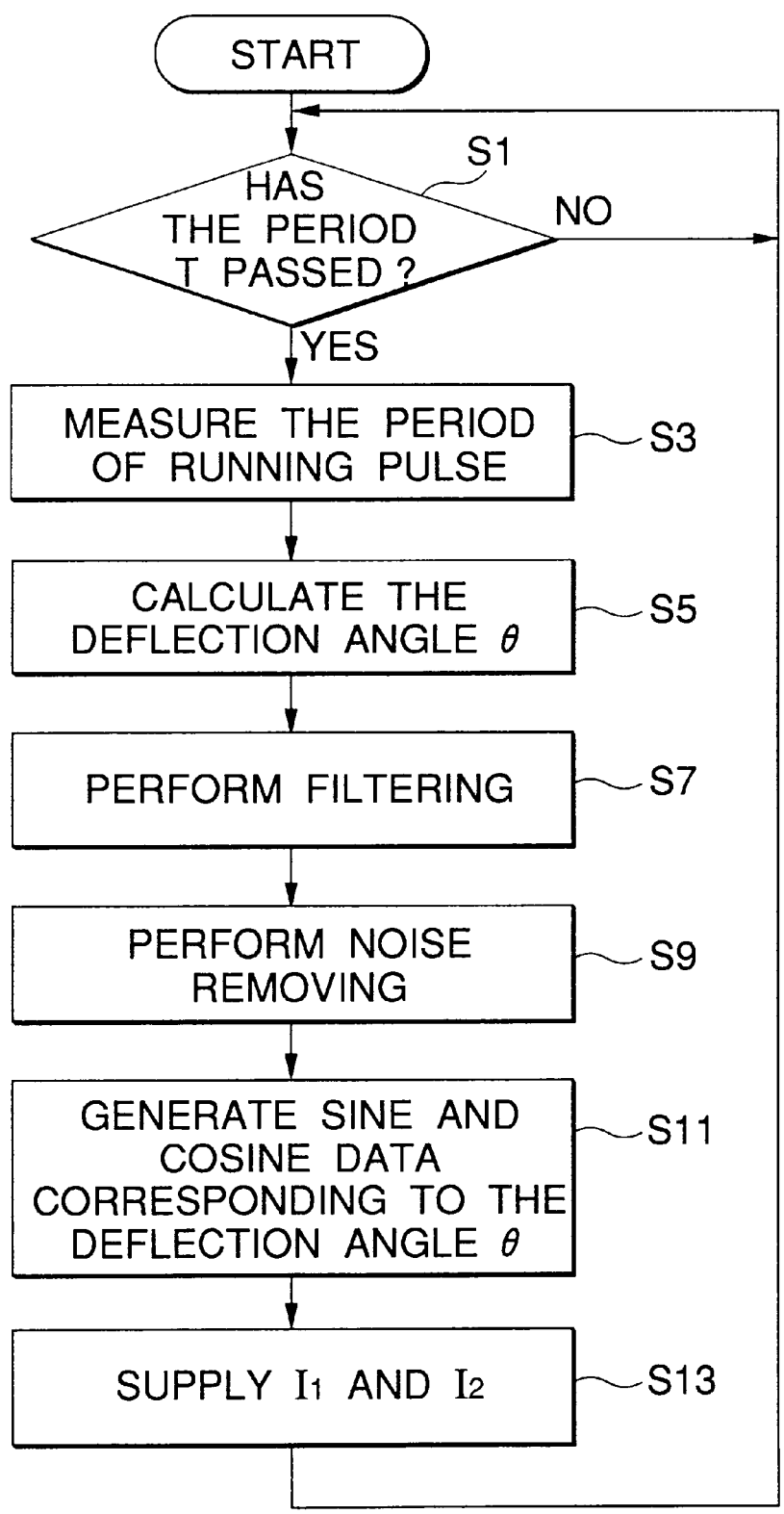
FIG. 3 is a flow chart of a main routine showing a processing for a one-chip microcomputer in FIG. 2 to be performed in accordance with a program stored in a ROM.

Next, the processing made by the CPU 10 in accordance with the control program stored in the ROM 10b will be described with reference to the flow charts in FIGS. 3 and 4.

When the microcomputer 10 starts up with the turning-on of a not-shown power supply to thereby make the program start, the CPU 10 confirms whether or not renewal period time T has passed from the start-up of the microcomputer 10 or from the completion of previous processing of Step S13, which will be described later, as shown in the flow chart of a main routine in FIG. 3, (Step S1). If the time T has not passed (N in Step S1), the CPU 10 repeats Step S1 till the time T has passed. If the time T has passed (Y in Step S1), the number of clock pulses of the basic clock generated by an internal clock is counted every period of a running pulse from the running sensor 30, so that the period of the running pulse is measured (Step S3).

Next, the deflection angle θ corresponding to the measured period of the running pulse is calculated by an operational expression stored in the ROM 10b (Step S5). Succeedingly, filtering is carried out (Step S7).

In this filtering, it is confirmed whether or not the difference between the deflection angle θ calculated by the arithmetic operation of Step S5 and the deflection angle θ calculated in the previous operation is in a predetermined range (for example, ±1). If it is in the range, the deflection angle θ is set to be the deflection angle θ calculated previously. On the other hand, if it is not in the range, the deflection angle θ is set to be the deflection angle θ calculated this time.

After the filtering of Step S7, noise removal is performed (Step S9).

Figure 4:
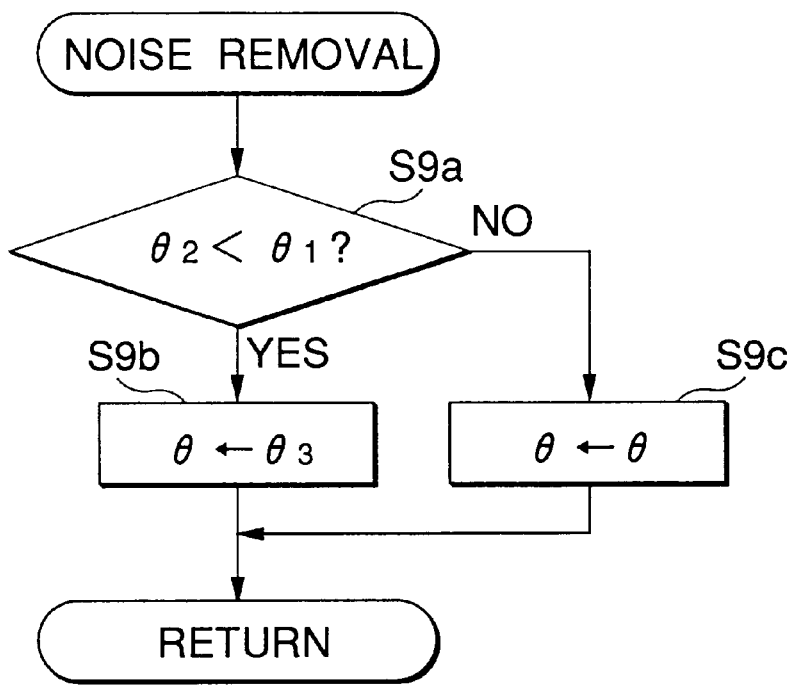
FIG. 4 is a flow chart of a sub-routine showing a noise removal processing in FIG. 3.

In the noise removal, as shown in the flow chart of a sub-routine in FIG. 4, it is confirmed whether or not a deflection angle difference $θ_2$ obtained by subtracting the deflection angle θ filtered in Step S7 from a deflection angle $θ_3$ outputted at present is smaller than the maximum fluctuating deflection angle $θ_1$ stored in the NVM 20 (Step S9a).

When the deflection angle difference $θ_2$ is smaller than the maximum fluctuating deflection angle $θ_1$ (Y in Step S9a), the deflection angle $θ_3$ outputted at present is succeedingly outputted as the deflection angle θ (Step S9b). After that, the processing ends the noise removal, and returns to the main routine in FIG. 3. If not smaller (N in Step S9a), the filtered deflection angle θ is outputted as the deflection angle θ (Step S9c). After that, the processing ends the noise removal, and returns to the main routine in FIG. 3.

In Step S11 in which the processing arrives after completion of the noise removal in Step S9, sine and cosine data corresponding to the filtered and noise-removed deflection angle θ are generated. Next, on the basis of duty pulse signals of duty ratios corresponding to the generated sine and cosine data, a first pulse current $I_1$ corresponding to the sine data of the deflection angle θ is supplied across the terminals $a_1$ and $a_2$ of the first coil $L_1$ of the cross coil L, while a second pulse current $I_2$ corresponding to the cosine data of the deflection angle θ is supplied across the terminals $b_1$ and $b_2$ of the second coil $L_2$ (Step S13). After that, the processing returns to Step S1.

The generation of the sine and cosine data corresponding to the filtered and noise-removed deflection angle θ in Step S11 may be performed in such a manner that the sine data of the deflection angle θ is first generated, and the cosine data of the deflection angle θ is generated by shifting the phase of this sine data by 90°, like in the sine function generating circuit 3 in Japanese Patent Unexamined Publication No. Hei. 1-201167, which was described in the Prior Art.

However, the manner of generation of the sine and cosine data is not limited to the above-mentioned one, but it may be such that the sine data of the deflection angle θ and the cosine data of the deflection angle θ are generated individually, or such that the cosine data of the deflection angle θ is first generated and the sine data of the deflection angle θ is then generated by shifting the phase of the sine data by 90° reversely.

As is apparent from the above description, in this embodiment, the driving pulse signal recited in claims is constituted by duty pulse signals corresponding to sine and cosine data, and first and second pulse currents $I_1$ and $I_2$. In addition, the period range judging means 10A recited in claims is realized by Step S9a in the flow chart of FIG. 4, while the after-change supply prevention means 10B is realized by Step 9b in FIG. 4.

Next, the operation (function) of the driving device in this embodiment configured thus will be described.

First, basically, the period of the running pulse after the change of the running speed is measured whenever the renewal period time T has passed. The deflection angle θ meeting the measured period is calculated. The magnet rotor Mg is rotated to the place of the deflection angle θ which has been subjected to filtering and noise-removal. Consequently, the place corresponding to the running speed of the vehicle is pointed by the pointer.

If the period of the running pulse from the running sensor 30 changes in response to the change of the running speed of the vehicle, the magnet rotor Mg is rotated to the place corresponding to the deflection angle θ meeting the running speed after change, at the time when the renewal period time T has passed since the magnet rotor Mg was rotated previously to the place corresponding to the deflection angle θ, so that the place corresponding to the after-change running speed is indicated by the pointer.

Figure 5:
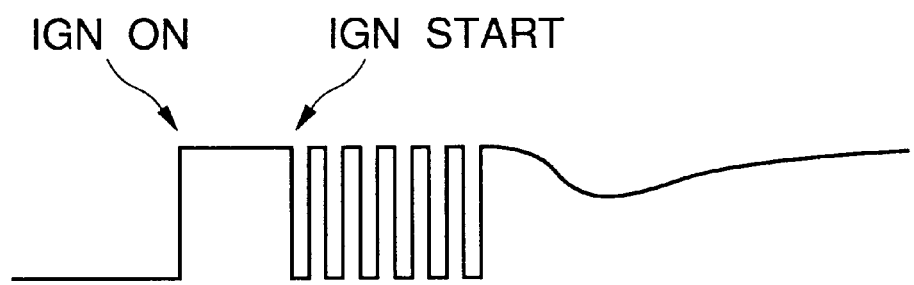
FIG. 5 is a waveform diagram illustrating an example of noise generated with the turning-on of an ignition switch.
Figures 6, 7:
FIG. 6 is a waveform diagram of a normal running pulse from a running sensor recognized by the one-chip microcomputer in FIG. 2 while a vehicle is at a stop.
FIG. 7 is a waveform diagram of an abnormal running pulse from the running sensor recognized by the one-chip microcomputer in FIG. 2 in a state in which the noise in FIG. 5 is superimposed while a vehicle is at a stop.

When a noise generated in response to the turning-on of the ignition switch (not-shown) in stoppage of the vehicle as shown in the waveform diagram of FIG. 5 is superimposed on the running pulse from the running sensor 30 in the above-mentioned basic operation so that the running pulse recognized by the CPU 10 includes a short-period pulse in which a low level and a high level are repeated in a fractional period as shown in the waveform diagram of FIG. 7 though the running pulse should be normally kept at such a low level as shown in the waveform of FIG. 6, the deflection angel θ calculated based on the period of the running pulse changes from the deflection angle θ calculated based on the period in a state in which the running pulse is kept at a low level, that is, the stoppage deflection angle $θ_0$, into a deflection angle θ with a considerably large value, that is, a deflection angle θ corresponding to the case in which the speed is considerably high.

Then, in the processing of noise removal where the running pulse is kept at a low level, the deflection angle difference $θ_2$ between the stoppage deflection angle $θ_0$ which is outputted as the deflection angle $θ_3$ to be used for generation of sine and cosine data, and the deflection angle $θ_4$ calculated based on the period of the running pulse including the noise in FIG. 5 exceeds the maximum fluctuating deflection angle $θ_1$ on a large scale. Therefore, so long as the deflection angle θ calculated based on the period of the running pulse is the deflection angle $θ_4$ calculated based on the period of the running pulse including the noise in FIG. 5, the stoppage deflection angle $θ_0$ calculated based on the period of the running pulse kept at a low level before generation of the running pulse including the noise is outputted as the deflection angle $θ_3$ to be used for generating the sine and cosine data.

Consequently, the first and second pulse currents $I_1$ and $I_2$ supplied across the terminals $a_1$ and $a_2$ of the first coil $L_1$ of the cross coil L and across the terminals $b_1$ and $b_2$ of the second coil $L_2$ of the cross coil L take values corresponding to the sine and cosine data generated correspondingly to the stoppage deflection angle $θ_0$ before or after the noise is superimposed on the running pulse. Simply speaking, the place pointed by the pointer is kept in the place indicating speed=0 corresponding to the stoppage state of the vehicle after or before the noise is superimposed on the running pulse.

When the superimposition of the noise onto the running pulse caused by the influence of the ignition switch is ceased, and a normal change occurs with the running of the vehicle in the period of the running pulse, the difference between the deflection angles θ respectively corresponding to after and before the change of the period is in the range of the maximum fluctuating deflection angle $θ_1$. Accordingly, in that case, the first and second pulse currents $I_1$ and $I_2$ having the values corresponding to the sine and cosine data generated correspondingly to the deflection angle θ after the change of the period are supplied across the terminals $a_1$ and $a_2$ of the first coil $L_1$ of the cross coil L and across the terminals $b_1$ and $b_2$ of the second coil $L_2$ of the cross coil L. Therefore, the place pointed by the pointer changes in response to the change of the running speed of the vehicle.

The frequency of noise caused by the influence of the ignition switch varies in accordance with the kind of the ignition switch and the structure near the ignition switch, etc., that is, the specification of the vehicle. Therefore, if the specification of the measuring meter is changed in accordance with the vehicle on which the measuring meter is mounted, the value of the maximum fluctuating deflection angle $θ_1$ also varies in accordance with the specification of the measuring meter.

Then, when the specification of the measuring meter is to be changed, the value of the maximum fluctuating deflection angle $θ_1$ in the NVM 20 may be rewritten into another value, or the NVM 20 may be replaced by another NVM 20 in which another maximum fluctuating deflection angle $θ_1$ with a value different from the original one which has been written therein.

According to the driving device in this embodiment as described above, in the case where the span of the fluctuation from the deflection angle θ calculated based on the period of the running pulse before change into the deflection angle θ calculated based on the period of the running pulse after change is not smaller than the maximum fluctuating deflection angle $θ_1$ stored in the NVM 20 when the period of the running pulse changes, sine and cosine data are generated from the deflection angle θ calculated based on the period of the running pulse before change even after the period of the running pulse has changed, and first and second pulse currents $I_1$ and $I_2$ corresponding to the sine and cosine data are supplied across the terminals $a_1$ and $a_2$ of the first coil $L_1$ of the cross coil L and across the terminals $b_1$ and $b_2$ of the second coil $L_2$ of the cross coil L.

Accordingly, even if a noise generated when an ignition switch is turned on is superimposed on the running pulse so that the period of the running pulse changes on a large scale independently of the change of the running speed of the vehicle, that is, even if the state of the running pulse changes into the same period as in the case where the vehicle is running at a high speed apparently notwithstanding the vehicle is at a stop, the pointer can be surely prevented from malfunctionally jumping with the change of the period to thereby point a high speed place.

The maximum fluctuating deflection angle $\theta_1$ may be written in a memory element incapable of exchange or a memory element incapable of rewriting, in this embodiment. However, if the angle $\theta_1$ is written in the NVM 20 independently of the CPU 10 as in this embodiment, advantageously, it is not necessary to perform exchange including the CPU 10 even if the value of the maximum fluctuating deflection angle $\theta_1$ is varied in accordance with the specification of the measuring meter, as mentioned above.

In addition, in this embodiment, if a memory element is provided for storing various data, values and so on required for other processing, such as the aforementioned predetermined value in filtering, that is, in the processing of preventing the pointer from fractionally oscillating by a small change in the running speed, maximum fluctuating deflection angles $\theta_1$ having the values different in accordance with the specifications of measuring meters can be stored by using only the memory element without providing any new memory element.

In addition, although one maximum fluctuating deflection angle $\theta_1$ is stored in the NVM 20 in this embodiment, numbers of values may be stored in advance as the maximum fluctuating deflection angle $\theta_1$ so that it is possible to select a desired one of the plural values of the maximum fluctuating deflection angle $\theta_1$ for example, by setting a dip switch. With such a configuration, it is advantageous to attain generality within the scope of the plural values of the maximum fluctuating deflection angle $\theta_1$ so as to make it possible to provide property of general use to cope with various specifications of measuring meters without rewriting or exchanging the NVM 20.

In addition, although the case where the portion of the driving device except the NVM 20 is constituted by the CPU 10 made into an integrated circuit was described in this embodiment, not to say, the present invention is applicable also to a driving device in which circuits are combined for individually performing the respective processings from the measurement of the period of the running pulse from the running sensor 30 to the supply of the first and second pulse currents $I_1$ and $I_2$ to the first and second coils $L_1$ and $L_2$ of the cross coil L.

As described above, according to the first aspect of the invention, there is provided a cross-coil measuring meter driving device which calculates an angle of deflection corresponding to a running speed of a vehicle on the basis of a period of a running pulse generated with running of the vehicle, generates a driving pulse signal of a duty ratio corresponding to the angle of deflection, and supplies the driving pulse signal to a cross coil to drive a magnet rotor Mg to rotate by the driving pulse signal so that a pointer connected to the magnet rotor Mg points at a point corresponding to the angle of deflection; characterized in that the driving device comprises: a period range judging means for judging whether or not the running pulse is within a predetermined range after the input state of the running pulse is shifted from the input state when the vehicle is at a stop to the input state when the vehicle is running; and an after-change supply prevention means for preventing the cross coil from being supplied with the driving pulse signal of a duty ratio corresponding to the angle of deflection calculated based on the period of the running pulse whenever the period range judging means judges that the period of the running pulse is not within the predetermined range; the driving pulse signal of a duty ratio corresponding to the angle of deflection calculated based on the period of the running pulse when the vehicle is at a stop being supplied to the cross coil meanwhile the after-change supply prevention means is preventing the cross coil from being supplied with the driving pulse signal of a duty ratio corresponding to the angle of deflection calculated based on the period of the running pulse.

Accordingly, once a noise generated at the time of turning-on of an ignition switch of a vehicle is superimposed on a running pulse signal, a pulse of a fractional period independent of the running of the vehicle is mixed into the running pulse signal to cause a change in the pulse period of the running pulse notwithstanding the vehicle is at a stop. Then, the input state of the running pulse is shifted from the input state when the vehicle is at a stop to the input state when the vehicle is running, and the pulse period of the running pulse is much shorter than the period at the time when the vehicle is at a stop because of the mixture of the fractional period pulse, so that the period range judging means judges that the period of the running pulse is not in a predetermined range.

Accordingly, a driving pulse signal of a duty ratio corresponding to an angle of deflection calculated based on the period of the running pulse when the vehicle is at a stop, is supplied to a cross coil before the fractional period pulse independent of the running of the vehicle becomes not mixed into the running pulse signal so that the period range judging means judges that the period of the running pulse is in the predetermined range. It is therefore possible to prevent a pointer from performing malfunction caused by the mixture of noise into the running pulse independently of the running of vehicle.

According to the second aspect of the invention, in the cross-coil measuring meter driving device of the first aspect of the invention, the period range judging means judges whether or not the running pulse is within the predetermined range, on the basis of a fact as to whether or not, when the angle of deflection calculated based on the running pulse changes from a stoppage angle of deflection corresponding to stoppage of the vehicle, the quantity of change of the angle of deflection from the stoppage angle of deflection is within a predetermined angle range corresponding to the predetermined range.

Accordingly, the angle of deflection calculated based on the period of the running pulse is used as a criterion of the period range judging means, instead of the period of the running pulse. It is therefore possible to calculate a threshold value to be set as a reference in accordance with the arrangement of divisions of a dial plate of a speed meter, the interval between the divisions, or the like, more easily than the period of the running pulse set as a reference.

According to the third aspect of the invention, in the cross-coil measuring meter driving device of the first or second aspect of the invention, a memory element is provided separately from an electric element relating to the operation to generate the driving pulse signal based on the running pulse and the operation to supply the driving pulse signal to the cross coil, and wherein the value of the predetermined range is stored in the memory element.

Accordingly, when the content of the predetermined range to be the criterion of the period range judging means changes in accordance with the specification of the measuring meter such as the arrangement of divisions of a dial plate of a speed meter, the interval between the divisions, or the like, it is possible to set the predetermined range in accordance with the specification of the measuring meter by rewriting or exchanging the memory element without exchanging the electric element per se, which relates to the operation to generate the driving pulse signal from the running pulse and the operation to supply the driving pulse signal to the cross coil.

What is claimed is:

1. A cross-coil measuring meter driving device which (1) calculates an angle of deflection corresponding to a running speed of a vehicle on the basis of a period of a running pulse generated with running of said vehicle, (2) generates a driving pulse signal of a duty ratio corresponding to said angle of deflection, and (3) supplies said driving pulse signal to a cross coil to rotate a magnet rotor, so that a pointer connected to said magnet rotor points at a point corresponding to said angle of deflection; said driving device comprising:

a period range judging means for judging whether or not said period of said running pulse is within a predetermined range, after an input state of said running pulse is shifted from an input state when said vehicle is at a stop to an input state when said vehicle is running; and an after-change supply prevention means for preventing said cross coil from being supplied with said driving pulse signal of a duty ratio corresponding to said angle of deflection calculated based on said period of said running pulse whenever said period range judging means judges that said period of said running pulse is not within said predetermined range;

wherein said driving pulse signal of a duty ratio corresponding to said angle of deflection calculated based on said period of said running pulse when said vehicle is at a stop is supplied to said cross coil, while said after-change supply prevention means is preventing said cross coil from being supplied with said driving pulse signal of a duty ratio corresponding to said angle of deflection calculated based on said period of said running pulse.

2. A cross-coil measuring meter driving device according to claim 1, wherein said period range judging means judges whether or not said period of said running pulse is within said predetermined range, on the basis of a fact as to whether or not, when said angle of deflection calculated based on said running pulse changes from a stoppage angle of deflection corresponding to stoppage of said vehicle, a quantity of change of said angle of deflection from said stoppage angle of deflection is within a predetermined angle range corresponding to said predetermined range.

3. A cross-coil measuring meter driving device according to claim 1, further comprising:

an electric element to generate said driving pulse signal based on said running pulse and supply said driving pulse signal to said cross coil; and a memory element provided separately from said electric element, a value of said predetermined range being stored in said memory element.

4. A cross-coil measuring meter driving device according to claim 2, further comprising:

an electric element to generate said driving pulse signal based on said running pulses and to supply said driving pulse signal to said cross coil; and a memory element provided separately from said electric element, a value of said predetermined range being stored in said memory element.

* * * * *